US007679596B2

(12) United States Patent
Kim et al.

(10) Patent No.: US 7,679,596 B2
(45) Date of Patent: Mar. 16, 2010

(54) DISPLAY DEVICE WITH REDUCED INTERFERENCE BETWEEN PIXELS

(75) Inventors: Sung-Man Kim, Seoul (KR); Jong-Hwan Lee, Gyeonggi-do (KR); Seong-Young Lee, Seoul (KR); Myung-Koo Hur, Gyeonggi-do (KR); Seung-Hwan Moon, Gyeonggi-do (KR); Hyang-Shik Kong, Gyeonggi-do (KR); Jang-Kun Song, Seoul (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 923 days.

(21) Appl. No.: 11/193,975

(22) Filed: Jul. 29, 2005

(65) Prior Publication Data

US 2006/0034125 A1 Feb. 16, 2006

(30) Foreign Application Priority Data

Aug. 3, 2004 (KR) ..................... 10-2004-0061066

(51) Int. Cl.
*G11C 11/34* (2006.01)

(52) U.S. Cl. .......................... 345/98; 345/87; 345/204; 349/39; 349/43; 349/59

(58) Field of Classification Search .................. 345/98, 345/204, 87; 349/39, 43, 59
See application file for complete search history.

(56) References Cited

U.S. PATENT DOCUMENTS 5,151,689 A * 9/1992 Kabuto et al. ............... 345/103
5,432,527 A * 7/1995 Yanai et al. ................... 345/92
6,011,532 A * 1/2000 Yanai et al. ................... 345/92
6,300,977 B1 * 10/2001 Waechter et al. ............ 348/300
6,456,269 B2 * 9/2002 Hirakata ...................... 345/92
6,545,653 B1 * 4/2003 Takahara et al. .............. 345/87
6,552,707 B1 * 4/2003 Fujiyoshi ..................... 345/98
6,707,441 B1 * 3/2004 Hebiguchi et al. ............ 345/92
6,982,690 B2 * 1/2006 Lee et al. ...................... 345/87
7,098,989 B2 * 8/2006 Wu ........................... 349/192
7,139,051 B2 * 11/2006 Park et al. .................. 349/113
7,277,092 B2 * 10/2007 Shen et al. ................. 345/204
7,327,338 B2 * 2/2008 Moon .......................... 345/87
7,391,401 B2 * 6/2008 Kim et al. ..................... 345/96
2004/0196232 A1 * 10/2004 Kim et al. ..................... 345/89
2005/0243044 A1 * 11/2005 Kang et al. ................... 345/87
2006/0120160 A1 * 6/2006 Park et al. .............. 365/185.22
2006/0164350 A1 * 7/2006 Kim et al. ...................... 345/87
2007/0097072 A1 * 5/2007 Kim et al. ................... 345/103

FOREIGN PATENT DOCUMENTS

WO WO03/100512 12/2003

* cited by examiner

*Primary Examiner*—Bipin Shalwala
*Assistant Examiner*—Afroza Y Chowdhury
(74) *Attorney, Agent, or Firm*—F. Chau & Associates, LLC.

(57) ABSTRACT

A display device according to an exemplary embodiment of the present invention includes: a plurality of pixels including switching elements; a plurality of pairs of first and second gate lines connected to the switching elements and separated from each other, transmitting a gate-on voltage for turning on the switching elements; and a plurality of data lines connected to the switching elements, transmitting data signals, wherein each pair of first and second gate lines is disposed between two adjacent pixel rows and is connected to one of the pixel rows.

18 Claims, 5 Drawing Sheets

DISPLAY DEVICE WITH REDUCED INTERFERENCE BETWEEN PIXELS

CROSS-REFERENCE TO RELATED APPLICATION

This application claims priority to Korean Patent Application No. 10-2004-0061066, filed on Aug. 3, 2004, in the Korean Intellectual Property Office, the disclosure of which is incorporated by reference herein in its entirety.

BACKGROUND OF THE INVENTION

1. Field of the Invention

The present invention relates to a display device, and more particularly to a display device with reduced interference between pixels.

2. Description of the Related Art

An active type display device such as an active matrix (AM) liquid crystal display (LCD) and an active matrix organic light emitting display (OLED) includes a plurality of pixels arranged in a matrix and including switching elements and a plurality of signal lines such as gate lines and data lines for transmitting signals to the switching elements. The switching elements of the pixels selectively transmit data signals from the data lines to the pixels in response to gate signals from the gate lines for displaying images. The pixels of the LCD adjust the transmittance of incident light depending on the data signals, while those of the OLED adjust the luminance of light emission depending on the data signals.

The display device further includes a gate driver for generating and applying the gate signals to the gate lines and a data driver for applying the data signals to the data lines. Each of the gate driver and the data driver generally includes several driving integrated circuit (IC) chips. The number of IC chips is preferably small to reduce manufacturing costs. In particular, the number of data driving IC chips is important since the data driving IC chips are more expensive than the gate driving IC chips.

SUMMARY OF THE INVENTION

A display device according to an exemplary embodiment of the present invention includes: a plurality of pixels including switching elements; a plurality of pairs of first and second gate lines connected to the switching elements, transmitting a gate-on voltage for turning on the switching elements; and a plurality of data lines connected to the switching elements, transmitting data signals, wherein each pair of first and second gate lines is disposed between two adjacent pixel rows and is connected to one of the pixel rows.

The first gate line may be closer to one of the pixel rows than the second gate line and supplied with the gate-on voltage earlier than the second gate line.

Each of the data lines may be connected to two adjacent pixel columns.

The two adjacent pixel columns may be disposed opposite each other with respect to one of the data lines. Two adjacent pixels in a column may be connected to the first and the second gate lines, respectively.

The two adjacent pixel columns may be disposed on the same side with respect to a data line. Two adjacent pixels in a column may be connected to different data lines.

The second gate line may be farther from the pixel row than the first gate line and the connection between the switching elements of the pixel row and the data lines may be routed between the first gate line and the second gate line from the data lines.

The display device may further include: a first gate driver connected to the first gate lines; and a second gate driver connected to the second gate lines.

Two adjacent gate lines may be simultaneously supplied with the gate-on voltage, at least in part.

The display device may execute column inversion or line inversion.

BRIEF DESCRIPTION OF THE DRAWINGS

The present invention will become more apparent by describing exemplary embodiments thereof in detail with reference to the accompanying drawings in which.

DETAILED DESCRIPTION OF EMBODIMENTS

Figure 1:
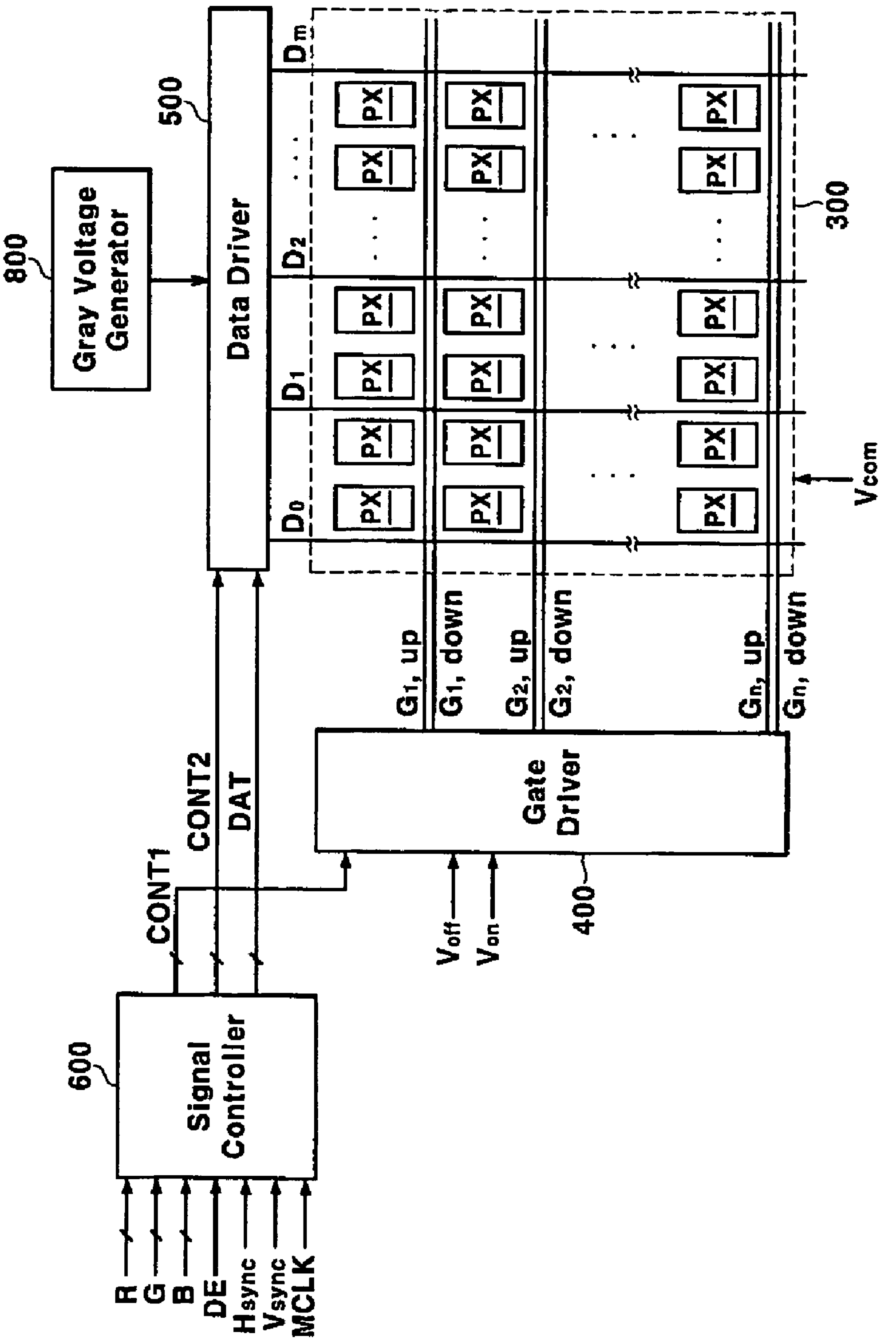
FIG. 1 is a block diagram of an LCD according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. When an element such as a layer, region or substrate is referred to as being "on" another element, it can be directly on the other element or intervening elements may also be present. In contrast, when an element is referred to as being "directly on" another element, there are no intervening elements present.

Liquid crystal displays, as an example of display devices according to embodiments of the present invention, will be described with reference to the accompanying drawings.

Figure 2:
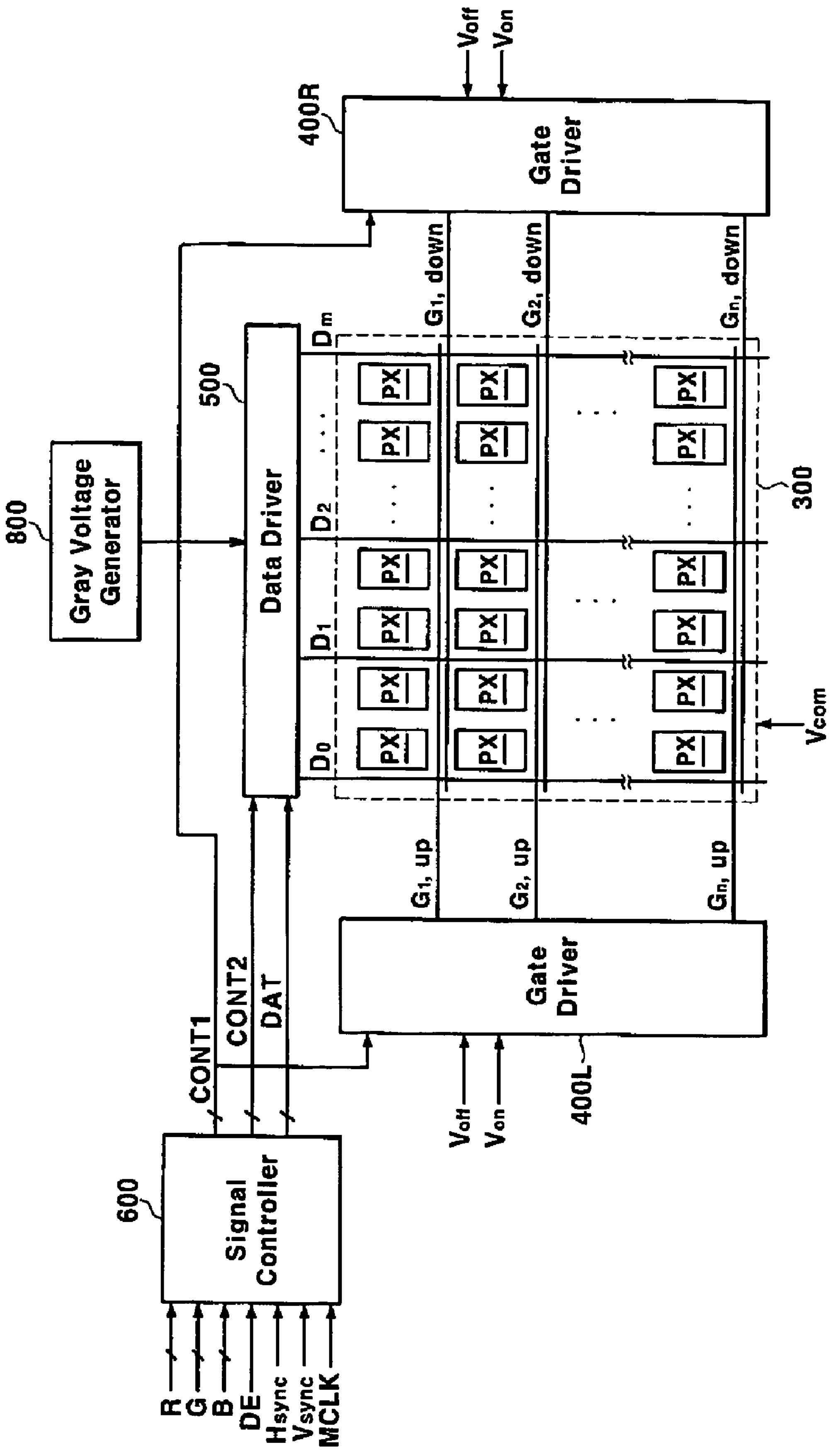
FIG. 2 is a block diagram of an LCD according to another embodiment of the present invention.
Figure 3:
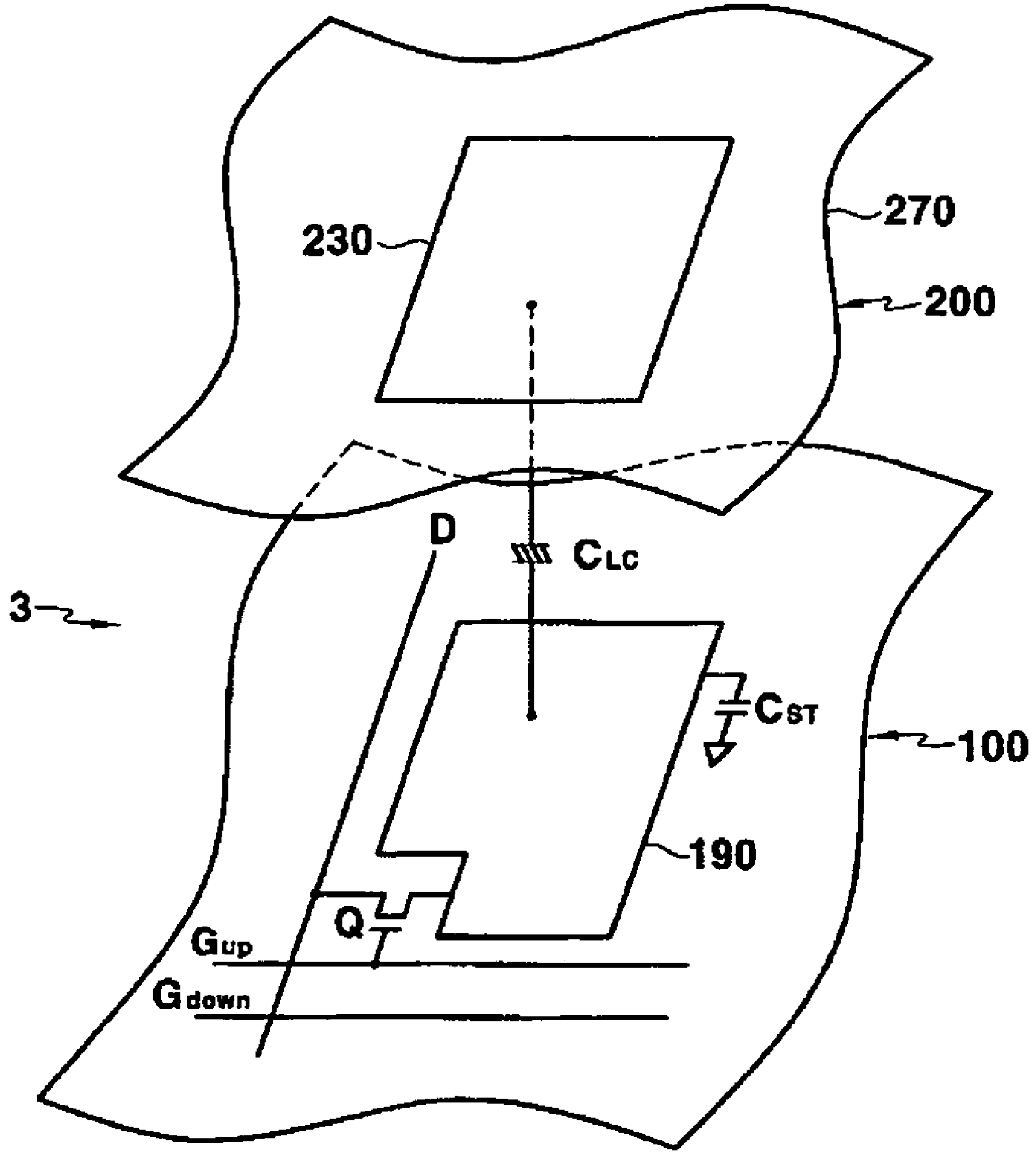
FIG. 3 is an equivalent circuit diagram of a pixel of an LCD according to an embodiment of the present invention.

FIG. 1 is a block diagram of an LCD according to an embodiment of the present invention, FIG. 2 is a block diagram of an LCD according to another embodiment of the present invention, and FIG. 3 is an equivalent circuit diagram of a pixel of an LCD according to an embodiment of the present invention.

Referring to FIGS. 1 and 2, an LCD according to an embodiment of the present invention includes a LC panel assembly 300, one or two gate driver(s) 400, or 400L and 400R, and a data driver 500 that are connected to the LC panel assembly 300, a gray voltage generator 800 connected to the data driver 500, and a signal controller 600 controlling the above elements.

Referring to FIGS. 1 and 2, the LC panel assembly 300 includes a plurality of display signal lines and pixels PX connected thereto and arranged substantially in a matrix. In a structural view shown in FIG. 3, the LC panel assembly 300 includes lower and upper panels 100 and 200 and a LC layer 3 interposed therebetween.

The display signal lines are disposed on the lower panel 100 and include a plurality of gate lines $G_{1,up}$-$G_{n,down}$ transmitting gate signals (also referred to as "scan signals"), and a plurality of data lines $D_0$-$D_m$ transmitting data signals. The gate lines $G_{1,up}$-$G_{n,down}$ extend substantially in rows which are substantially parallel to each other, while the data lines $D_0$-$D_m$ extend substantially in columns which are substantially parallel to each other.

Referring to FIG. 3, each pixel PX includes a switching element Q connected to the display signal lines, and a LC capacitor $C_{LC}$, and optionally a storage capacitor $C_{ST}$, connected to the switching element Q.

The switching element Q including a thin film transistor (TFT) is provided on the lower panel 100 and has three terminals: a control terminal connected to one of the gate lines $G_{1,up}$-$G_{n,down}$; an input terminal connected to one of the data lines $D_0$-$D_m$; and an output terminal connected to both the LC capacitor $C_{LC}$ and the optional storage capacitor $C_{ST}$.

The LC capacitor $C_{LC}$ includes a pixel electrode 190 provided on the lower panel 100 and a common electrode 270 provided on the upper panel 200 as two terminals. The LC layer 3 disposed between the two electrodes 190 and 270 functions as a dielectric for the LC capacitor $C_{LC}$. The pixel electrode 190 is connected to the switching element Q, and the common electrode 270 is supplied with a common voltage Vcom and covers the entire surface of the upper panel 200. Unlike FIG. 3, the common electrode 270 may be provided on the lower panel 100, and at least one of the electrodes 190 and 270 may have the shape of a bar or a stripe.

The storage capacitor $C_{ST}$ is an auxiliary capacitor for the LC capacitor $C_{LC}$. The storage capacitor $C_{ST}$ includes the pixel electrode 190 and a separate signal line, which is provided on the lower panel 100, overlaps the pixel electrode 190 via an insulator, and is supplied with a predetermined voltage such as the common voltage Vcom. Alternatively, the storage capacitor $C_{ST}$ includes the pixel electrode 190 and an adjacent gate line called a previous gate line, which overlaps the pixel electrode 190 via an insulator.

For a color display, each pixel PX uniquely represents one of the primary colors (i.e., spatial division) or each pixel PX sequentially represents the primary colors in turn (i.e., temporal division) such that the spatial or temporal sum of the primary colors are recognized as a desired color. FIG. 3 shows an example of the spatial division where each pixel PX includes a color filter 230 representing one of the primary colors in an area of the upper panel 200 facing the pixel electrode 190. Alternatively, the color filter 230 is provided on or under the pixel electrode 190 on the lower panel 100.

An example of a set of the primary colors includes red, green, and blue. The pixels PX including red, green, and blue color filters 230 are referred to as red, green, and blue pixels PX, respectively.

One or more polarizers (not shown) are attached to at least one of the panels 100 and 200. In addition, one or more retardation films (not shown) for compensating refractive anisotropy may be disposed between the polarizer(s) and the panel(s).

Figure 4:
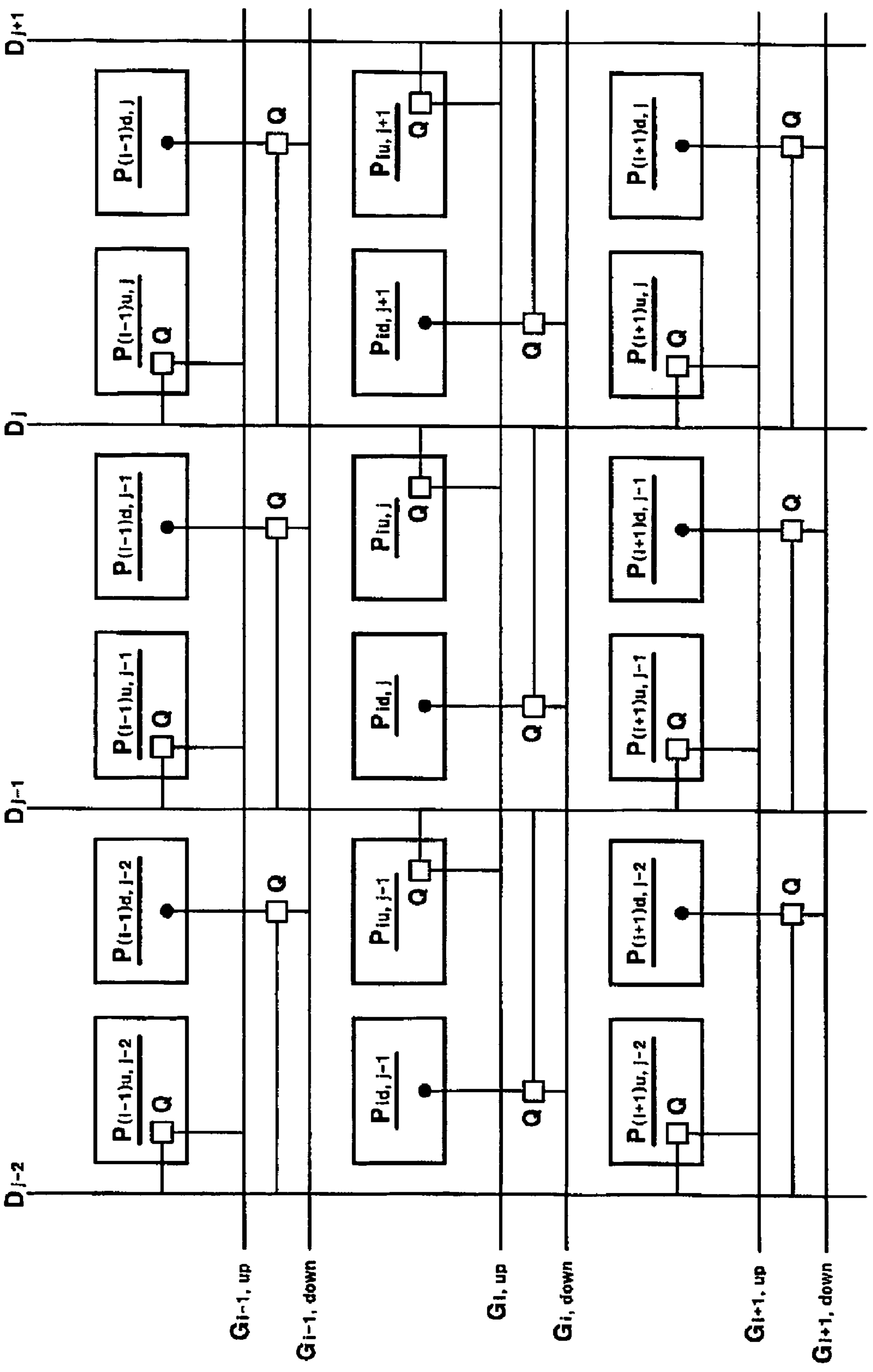
FIG. 4 illustrates an arrangement of the pixels and the display signal lines according to an embodiment of the present invention.
Figure 5:
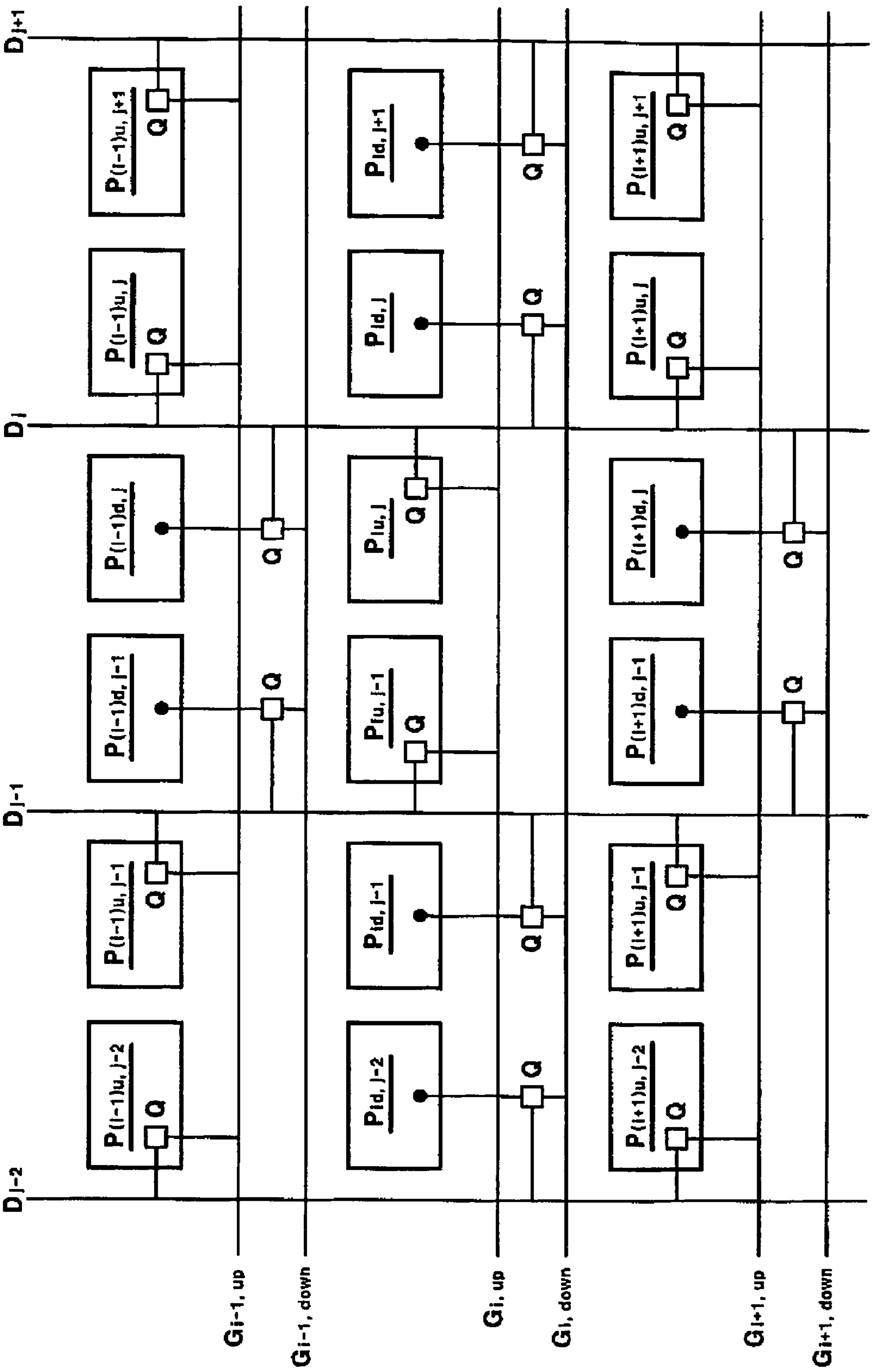
FIG. 5 illustrates an arrangement of the pixels and the display signal lines according to another embodiment of the present invention.

Referring to FIGS. 4 and 5, arrangements of gate lines, data lines, and pixels PX according to exemplary embodiments of the present invention are described in detail.

FIG. 4 illustrates an arrangement of the pixels PX and the display signal lines according to an embodiment of the present invention and FIG. 5 illustrates an arrangement of the pixels PX and the display signal lines according to another embodiment of the present invention.

Referring to FIGS. 4 and 5, a pair of gate lines, one upper and one lower, is disposed between every row of pixels PX, and a data line is disposed between every two columns of pixels PX. Accordingly, two pixels PX, one left and one right, are disposed between a pair of adjacent data lines in each pixel row.

As described above, each pixel PX is connected to a gate line and a data line through a switching element Q. In FIGS. 4 and 5 each pixel PX is notated as $P_{g,d}$ where g indicates the gate line it is connected to and d indicates the data line it is connected to. For example, the pixel PX in the lower left corner of FIG. 4 notated as $P_{(i+1)u,j-2}$ is the pixel PX connected to gate line $G_{i+1,up}$ and data line $D_{j-2}$.

Referring to FIG. 4, each pixel PX in a pair of pixels PX disposed between two adjacent data lines is connected to the same data line and to different gate lines.

The pixel connections to the data lines alternate by pixel row, for example, both of the pixels PX of the pixel pairs in a given pixel row connect to the data lines disposed immediately to the left of the pixel pairs and both of the pixels PX of the pixel pairs in the pixel rows immediately above and below the given pixel row connect to the data lines disposed immediately to the right of the pixel pairs.

The pixel connections to the gate lines are arranged such that the pixels PX of each pixel pair that are closer to the data lines connect to the upper gate lines of the pair of gate lines disposed immediately below the pixel pairs and the pixels PX of each pixel pair that are farther from the data lines connect to the lower gate lines of the pair of gate lines disposed immediately below the pixel pairs.

For example, for two pixels PX, $P_{iu,j}$ on the right side of a pixel pair and $P_{id,j}$ on the left side of a pixel pair, disposed between two adjacent data lines, $D_{j-1}$ to the left of their pixel column and $D_j$ to the right of their pixel column, both pixels PX are connected to the data line $D_j$ to the right of their pixel column. The pixel $P_{iu,j}$ on the right side of their pixel column, close to the data line $D_j$ to the right of their pixel column, is connected to an upper gate line $G_{i,up}$ of a pair of gate lines $G_{i,up}$ and $G_{i,down}$, disposed therebelow, and the pixel $P_{id,j}$ on the left side of their pixel column, far from the data line $D_j$ to the right of their pixel column, is connected to a lower gate line $G_{i,down}$. However, for two pixels PX disposed between the same two data lines in adjacent pixel rows immediately above or below the original example row, both pixels PX are connected to the data line to the left of their pixel column. Also, in this case, the pixel PX on the left side of their pixel column, close to the data line to the left of their pixel column, is connected to an upper gate line of a pair of gate lines, disposed therebelow, and the pixel PX on the right side of their pixel column, far from the data line to the left of their pixel column, is connected to a lower gate line of a pair of gate lines, disposed therebelow.

As shown in FIG. 4, the pixels PX that are close to the data lines are connected to upper gate lines and the pixels PX that are far from the data lines are connected to lower gate lines.

Referring to FIG. 5, each pixel PX of a pair of pixels PX disposed between two adjacent data lines is connected to the same gate line and to different data lines. The pixels PX in the pixel pairs connect to data lines that are closer. That is, the pixels PX on the left side of the pixel pairs connect to the data lines disposed immediately to the left of the pixel pairs and the pixels. PX on the right side of the pixel pairs connect to the data lines disposed immediately to the right of the pixel pairs. The connections to the gate lines alternate such that for any given pixel pair that connects to the upper gate line of the pair of gate lines disposed immediately below the pixel pair, the pixel pairs immediately above, below, to the left and to the right of the given pixel pair connect to the lower gate lines of the pair of gate lines disposed immediately below the pixel pairs. For example, for two pixels, $P_{iu,j-1}$ on the left side of a pixel pair and $P_{iu,j}$ on the right side of a pixel pair, disposed between two adjacent data lines, $D_{j-1}$ to the left of their pixel column and $D_j$ to the right of their pixel column, both pixels PX are connected to an upper gate line $G_{i,up}$ of a pair of gate lines $G_{i,up}$ and $G_{i,down}$, disposed therebelow. The pixel $P_{iu,j-1}$ on the left side of their pixel column is connected to the data line $D_{j-1}$ to the left of their pixel pair, and the pixel $P_{iu,j}$ on the right side of their pixel pair is connected to the data line $D_j$ to the right of their pixel column. However, for two pixels PX disposed between the same two data lines in adjacent pixel rows immediately above, below, to the left of or to the right of the original example row, both pixels PX are connected to the lower gate lines, disposed therebelow.

The number of data lines $D_0$-$D_m$ is equal to half of the number of pixel columns and the number of gate lines $G_{1,up}$-$G_{n,down}$ is twice the number of pixel rows.

A data line connected to a switching element Q, which is connected a lower one of a pair of gate lines, is routed between the gate lines as shown in FIGS. 4 and 5.

Referring to FIGS. 1 and 2 again, the gray voltage generator 800 generates two sets of a plurality of gray voltages related to the transmittance of the pixels PX. The gray voltages in a first set have a positive polarity with respect to the common voltage Vcom, while those in a second set have a negative polarity with respect to the common voltage Vcom.

The gate driver(s) 400 or 400L and 400R, is connected to the gate lines $G_{1,up}$-$G_{n,down}$ of the LC panel assembly 300 and synthesizes the gate-on voltage Von and the gate-off voltage Voff from an external device to generate gate signals for application to the gate lines $G_{1,up}$-$G_{n,down}$. Referring to FIG. 1, one gate driver 400 is provided at a left side of the LC panel assembly 300. FIG. 2 shows that a pair of gate drivers 400L and 400R is provided at the left and right sides of the LC panel assembly 300, respectively. The left gate driver 400L is connected to an upper gate line of each pair of gate lines, and the right gate driver 400R is connected to a lower gate line. However, the connection between the gate drivers 400L and 400R may be made in an opposite manner.

The data driver 500 is connected to the data lines $D_0$-$D_m$ of the LC panel assembly 300 and applies data voltages, which are selected from the gray voltages supplied from the gray voltage generator 800, to the data lines $D_0$-$D_m$.

The gate driver(s) 400, or 400L and 400R, and the data driver 500 may include at least one integrated circuit (IC) chip mounted on the LC panel assembly 300 or on a flexible printed circuit (FPC) film in a tape carrier package (TCP), and are attached to the LC panel assembly 300. Alternately, the gate driver(s) 400, or 400L and 400R, and data driver 500 may be integrated into the LC panel assembly 300 along with the gate lines $G_{1,up}$-$G_{n,down}$, the data lines $D_0$-$D_m$ and the switching elements Q.

The signal controller 600 controls the gate driver(s) 400, or 400L and 400R, and the data driver 500.

Now, the operation of the above-described LCD will be described in detail.

The signal controller 600 is supplied with input image signals R, G and B and input control signals controlling the display thereof, such as a vertical synchronization signal Vsync, a horizontal synchronization signal Hsync, a main clock MCLK, and a data enable signal DE, from an external graphics controller (not shown). After generating gate control signals CONT1 and data control signals CONT2 and processing the input image signals R, G and B suitably for the operation of the LC panel assembly 300 on the basis of the input control signals and the input image signals R, G and B, the signal controller 600 transmits the gate control signals CONT1 to the gate driver(s) 400, or 400L and 400R, and the processed image data DAT and the data control signals CONT2 to the data driver 500. The processing of the input image signals R, G and B includes the rearrangement of the image data DAT according to the pixel arrangement of the LC panel assembly 300 shown in FIGS. 4 and 5.

The gate control signals CONT1 include a scan start signal STV for initiating scanning and at least one clock signal for controlling the output duration of the gate-on voltage Von. The gate control signals CONT1 may further include an output enable signal OE for defining the duration of the gate-on voltage Von.

The data control signals CONT2 include a horizontal synchronization start signal STH for indicating the start of data transmission for a group of pixels, a load signal LOAD for controlling the application of the data voltages to the data lines $D_0$-$D_m$, and a data clock signal HCLK. The data control signals CONT2 may further include an inversion signal RVS for reversing the polarity of the data voltages with respect to the common voltage Vcom.

Responsive to the data control signals CONT2 from the signal controller 600, the data driver 500 receives a packet of the image data DAT for half of a row of pixels from the signal controller 600, converts the image data DAT into analog data voltages selected from the gray voltages supplied from the gray voltage generator 800, and applies the data voltages to the data lines $D_0$-$D_m$.

The gate driver(s) 400, or 400L and 400R, applies the gate-on voltage Von to the gate line $G_{1,up}$-$G_{n,down}$ in response to the gate control signals CONT1 from the signal controller 600, thereby activating the switching elements Q connected thereto. The data voltages applied to the data lines $D_0$-$D_m$ are supplied to the pixels through the activated switching elements Q.

The difference between the data voltage and the common voltage Vcom is represented by a voltage across the LC capacitor $C_{LC}$, which is referred to as a pixel voltage. The LC molecules in the LC capacitor $C_{LC}$ have molecular orientations depending on the magnitude of the pixel voltage, and the molecular orientations determine the polarization of the light passing through the LC layer 3. The polarizer(s) converts the light polarization into light transmittance.

By repeating this procedure by half of a horizontal line period (denoted by "½ H" and equal to half the period of the horizontal synchronization signal Hsync or the data enable signal DE), the gate lines $G_{1,up}$-$G_{n,down}$ are sequentially supplied with the gate-on voltage Von during a frame, thereby applying the data voltages to the pixels. When the next frame starts after one frame finishes, the inversion control signal RVS applied to the data driver 500 is controlled such that the polarity of the data voltage is reversed (referred to as "frame inversion"). The inversion control signal RVS may also be controlled such that the polarity of the data voltage flowing in a data line in one frame is reversed (for example, line inversion and dot inversion), or the polarity of the data voltage in one packet is reversed (for example, column inversion and dot inversion).

Although the time for charging a row of pixels is reduced by half as compared with a conventional LCD, it may be compensated for by applying a gate signal to two adjacent gate lines, at least in part.

Referring to FIGS. 4 and 5 again, for a pair of gate lines disposed between two pixel rows, for example, the gate lines denoted by reference numerals $G_{i,up}$ and $G_{i,down}$, an upper gate line $G_{i,up}$ is first supplied with the gate-on voltage Von, and a lower gate line $G_{i,down}$ is subsequently supplied with the gate-on voltage Von. Since the lower gate line $G_{i,down}$ which is supplied later with the gate-on voltage Von is spaced apart from the pixel row which is supplied earlier with the gate-on voltage Von, by interposing the upper gate line $G_{i,up}$ between them, the pixel row is minimally affected by the electromagnetic field emitted from the lower gate line $G_{i,down}$ when it carries the gate-on voltage Von. The electromagnetic field is weakened when it reaches the pixel row due to the greater distance between the lower gate line $G_{i,down}$ and the pixel row, and also due to a shielding effect from the upper gate line $G_{i,up}$.

In the arrangement shown in FIG. 5, two pixels PX disposed between two adjacent data lines are connected to a single gate line and are simultaneously charged thereby reducing the interference between them as compared with being consecutively charged.

The interference between the gate lines and the pixels PX can be reduced without a decrease in aperture ratio, thereby improving the image quality of the LCD.

The present invention can also be employed with other display devices such as OLEDs.

Although preferred embodiments of the present invention have been described in detail herein, it should be clearly understood that many variations and/or modifications of the basic inventive concepts herein taught which may appear to those skilled in the present art will still fall within the spirit and scope of the present invention, as defined in the appended claims.

What is claimed is:

1. A display device comprising:

a plurality of pixels including switching elements, wherein the pixels are arranged in pixel rows and pixel columns;

a plurality of pairs of first and second gate lines connected to the switching elements, transmitting a gate-on voltage for turning on the switching elements; and a plurality of data lines connected to the switching elements, wherein each pair of first and second gate lines is disposed between two adjacent pixel rows and connected to the switching elements of one of the pixel rows, wherein pairs of pixels are disposed between adjacent data lines, wherein the switching elements of a pair of adjacent pixels disposed between adjacent data lines are connected to the same first gate line or to the same second gate line, and wherein each of the data lines is connected to the switching elements of two adjacent pixel columns.

2. The display device of claim 1, wherein the first gate line is closer to the one of the pixel rows than the second gate line, and is supplied with the gate-on voltage earlier than the second gate line.

3. The display device of claim 1, wherein the two adjacent pixel columns are disposed opposite each other with respect to one of the data lines.

4. The display device of claim 1, wherein two adjacent pixels in a column are connected to the first and the second gate lines, respectively.

5. The display device of claim 1, wherein each of the data lines is disposed between alternate pixel columns.

6. The display device of claim 1, wherein the second gate line is disposed farther from the pixel row than the first gate line, and wherein the connection between the switching elements of the pixel row and the data lines is routed between the first gate line and the second gate line.

7. The display device of claim 1, further comprising:

a first gate driver connected to the first gate lines; and a second gate driver connected to the second gate lines.

8. The display device of claim 1, wherein two adjacent gate lines are simultaneously supplied with the gate-on voltage, at least in part.

9. The display device of claim 1, wherein the display device executes column inversion or line inversion.

10. The display device of claim 1, wherein the first gate lines of the pairs of first and second gate lines are closer to the pixel rows they connect to than the second gate lines of the pairs of first and second gate lines.

11. The display device of claim 1, wherein each pixel of the pair of adjacent pixels connects to its closest data line, and the first or second gate line to which the pair of adjacent pixels is connected alternates with each pixel row.

12. The display device of claim 1, wherein the switching elements of two pixels on opposite sides of the same data line connect to the same data line.

13. A display device comprising:

a plurality of pixels including switching elements, wherein the pixels are arranged in pixel rows and pixel columns;

a plurality of pairs of first and second gate lines connected to the switching elements, transmitting a gate-on voltage for turning on the switching elements; and a plurality of data lines connected to the switching elements, wherein each pair of first and second gate lines is disposed between two adjacent pixel rows and connected to the switching elements of one of the pixel rows, wherein pairs of pixels are disposed between adjacent data lines, and wherein two adjacent pixels in a same column are connected to different data lines.

14. The display device of claim 13, wherein the first gate line is closer to one of the pixel rows than the second gate line, and is supplied with the gate-on voltage earlier than the second gate line.

15. The display device of claim 13, wherein each of the data lines is connected to the switching elements of two adjacent pixel columns.

16. The display device of claim 15, wherein two adjacent pixels in a column are connected to the first and the second gate lines, respectively.

17. The display device of claim 13, wherein the second gate line is disposed farther from a pixel row than the first gate line, and wherein the connection between switching elements of the pixel row and the data lines is routed between the first gate line and the second gate line.

18. The display device of claim 15, wherein two adjacent gate lines are simultaneously supplied with the gate-on voltage, at least in part.

* * * * *